(12) United States Patent
Wang et al.

(10) Patent No.: US 9,444,030 B2
(45) Date of Patent: Sep. 13, 2016

(54) NANOPOROUS PIEZOELECTRIC POLYMER FILMS FOR MECHANICAL ENERGY HARVESTING

(71) Applicant: Wisconsin Alumni Research Foundation, Madison, WI (US)

(72) Inventors: Xudong Wang, Madison, WI (US); Yanchao Mao, Madison, WI (US); Ping Zhao, Duluth, MN (US)

(73) Assignee: Wisconsin Alumni Research Foundation, Madison, WI (US)

( * ) Notice: Subject to any disclaimer, the term of this patent is extended or adjusted under 35 U.S.C. 154(b) by 686 days.

(21) Appl. No.: 13/891,291

(22) Filed: May 10, 2013

(65) Prior Publication Data

US 2014/0333184 A1    Nov. 13, 2014

(51) Int. Cl.
| | |
|---|---|
| H01L 41/113 | (2006.01) |
| H01L 41/22 | (2013.01) |
| H01L 41/18 | (2006.01) |
| H01L 41/45 | (2013.01) |
| H01L 41/193 | (2006.01) |

(52) U.S. Cl.
CPC ........... *H01L 41/113* (2013.01); *H01L 41/193* (2013.01); *H01L 41/45* (2013.01)

(58) Field of Classification Search
CPC ...... H01L 41/39; H01L 41/22; B41J 2/1623; B41J 2/161; H03H 3/02; B82Y 30/00; C08J 3/12; C01P 2004/61; C01P 2004/62; C01P 2004/64
USPC ................. 310/311, 800, 339, 328; 29/25.35
See application file for complete search history.

(56) References Cited

U.S. PATENT DOCUMENTS

| | | | | |
|---|---|---|---|---|
| 4,177,228 | A * | 12/1979 | Prolss | 264/413 |
| 4,751,013 | A * | 6/1988 | Kaarmann | C04B 38/067 252/62.9 R |
| 5,841,493 | A * | 11/1998 | Lipskier | C08J 5/18 252/299.01 |
| 2001/0023014 | A1* | 9/2001 | Patel | B41M 5/0047 428/32.17 |
| 2005/0186461 | A1 | 8/2005 | Hommura et al. | |
| 2007/0205398 | A1* | 9/2007 | Smela | B82Y 30/00 252/500 |
| 2008/0168840 | A1 | 7/2008 | Seeley et al. | |
| 2010/0208325 | A1* | 8/2010 | Piroux | G02F 1/15 359/268 |
| 2011/0021916 | A1* | 1/2011 | Morita | 600/443 |
| 2012/0029416 | A1* | 2/2012 | Parker | A61F 13/02 604/20 |
| 2012/0068572 | A1 | 3/2012 | Jenninger et al. | |

(Continued)

FOREIGN PATENT DOCUMENTS

WO    WO2012/018890    2/2012

OTHER PUBLICATIONS

He et al., Unzipped multiwalled carbon nanotubes-incorporated poly(vinylidene fluoride) nanocomposites with enhanced interface and piezoelectric beta phase, Journal of Colloid and Interface Science, vol. 393, Nov. 15, 2012, pp. 97-103.

(Continued)

*Primary Examiner* — Thomas Dougherty
(74) *Attorney, Agent, or Firm* — Bell & Manning, LLC

(57) ABSTRACT

Piezoelectric materials based on nanoporous polymer foams are provided. Also provided are nanogenerators incorporating the piezoelectric materials, piezoelectric energy harvesters incorporating the nanogenerators and methods of making and using the same. The piezoelectric materials comprise a unitary nanoporous matrix composed of a piezoelectrically active organic polymer, in which the pores are interconnected and have nanoscale diameters.

22 Claims, 14 Drawing Sheets

(56) References Cited

U.S. PATENT DOCUMENTS

2012/0088994 A1* 4/2012 Bode .................. A61B 5/14503
                                                        600/345
2013/0020909 A1* 1/2013 Kim ........................ H02N 2/18
                                                        310/339
2013/0038299 A1    2/2013 Sohn et al.

OTHER PUBLICATIONS

Wong et al., Macroporous polymers from particle-stabilized foams, J. Mater. Chem., vol. 19, Jun. 25, 2009, pp. 5129-5133.

J. Dodds, Development of Piezoelectric Zinc Oxide Nanoparticle-Poly(Vinylidene Fluoride) Nanocomposites for Sensing and Actuation, 2012.

Harrison et al., Piezoelectric Polymers, NASA/CR-2001-211422, ICASE Report No. 2001-43, Prepared for Langley Research Center under Contract NAS1-97046, Dec. 2001, pp. 1-26.

Wong et al., PVDF Particle-stabilized Polymeric Foams as Piezoelectric Space-charge Electrets, 19th International Conference on Adaptive Structures and Technologies, Ascona, Switzerland, Oct. 6-9, 2008.

Chang et al., Direct-Write Piezoelectric Polymeric Nanogenerator with High Energy Conversion Efficiency, Nano Lett., vol. 10, Jan. 25, 2010, pp. 726-731.

Cha et al., Porous PVDF as Effective Sonic Wave Driven Nanogenerators, Nano Lett., vol. 11, Nov. 22, 2011, pp. 5142-5147.

Wong et al., Piezoelectric Polymer Electrets from Particle-Stabilized Foams, published at http://akira.ethz.ch/~stweb/poster_pdf.php?id=23 on or before Apr. 15, 2013.

* cited by examiner

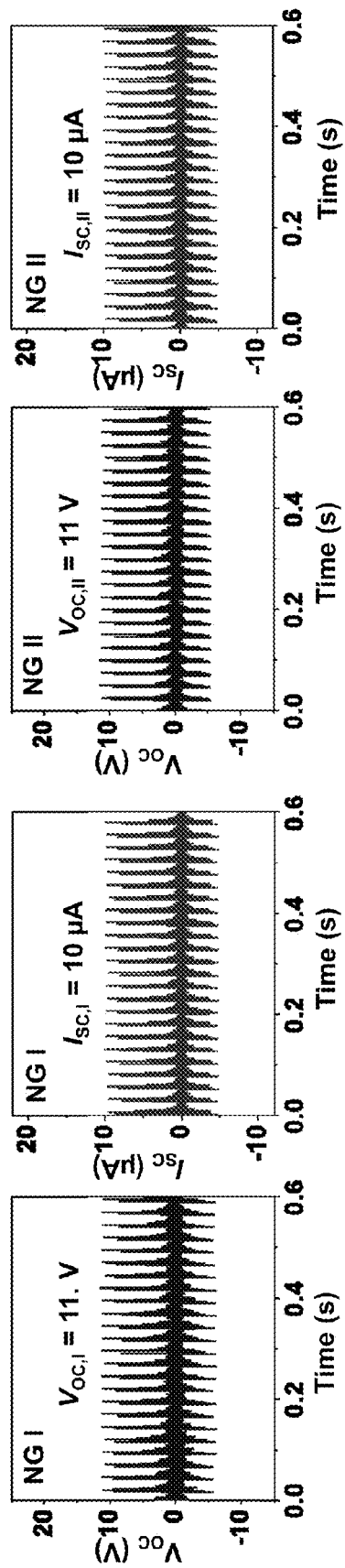

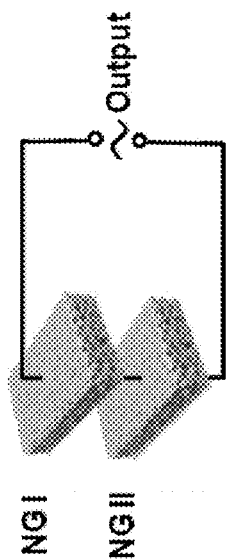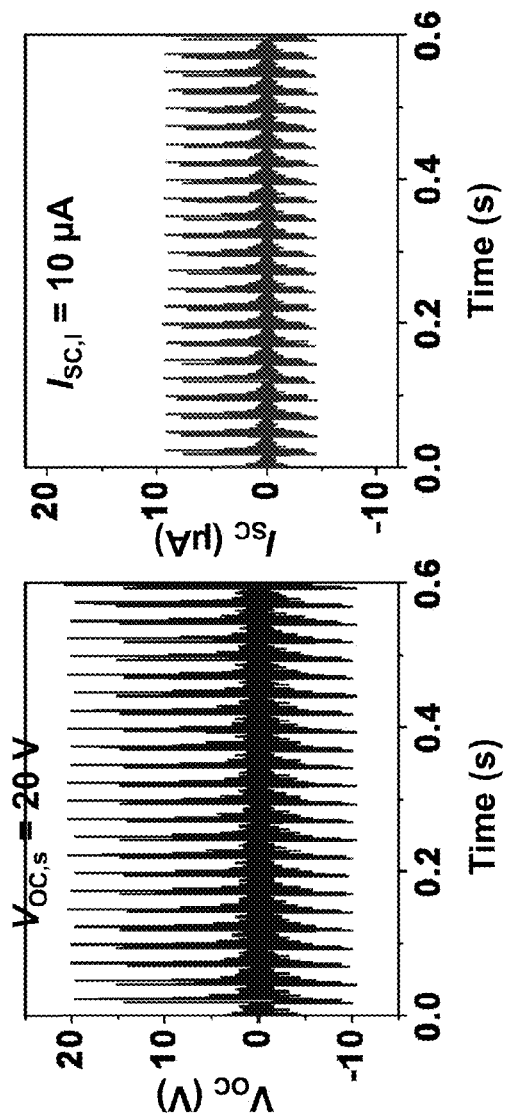
FIG. 9A
FIG. 9B
FIG. 9C

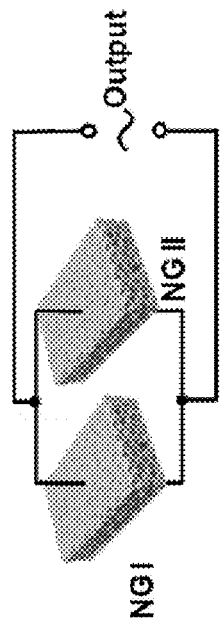
FIG. 10A
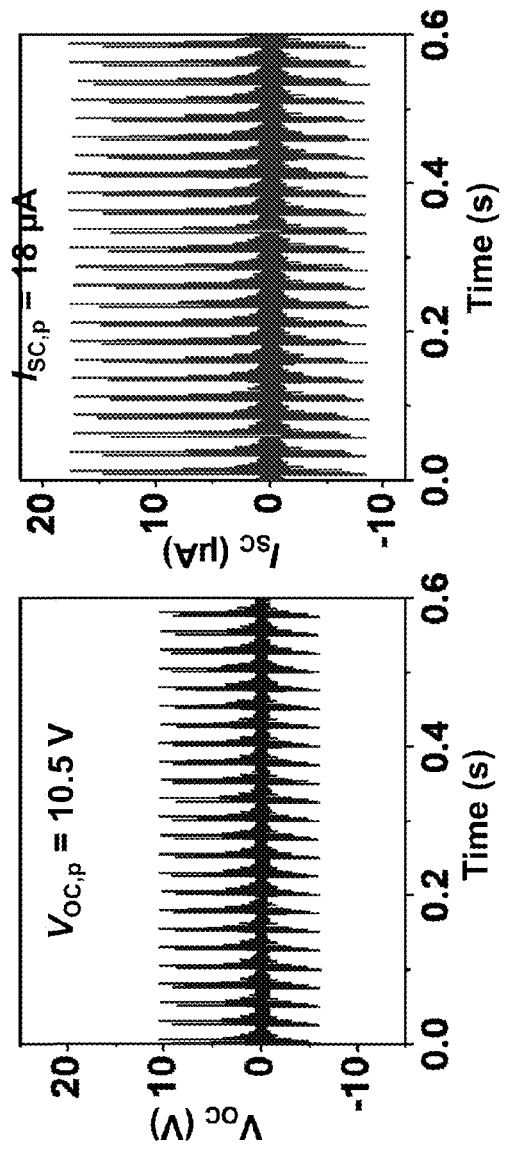
FIG. 10B
FIG. 10C

NANOPOROUS PIEZOELECTRIC POLYMER FILMS FOR MECHANICAL ENERGY HARVESTING

REFERENCE TO GOVERNMENT RIGHTS

This invention was made with government support under N66001-11-1-4139 awarded by the US Navy. The government has certain rights in the invention.

BACKGROUND

Nanogenerators (NGs) are nanometer-scale devices that use piezoelectric materials to harvest mechanical energy from ambient sources. Owing to the superior mechanical and electromechanical properties of nanoscale structures, NGs have demonstrated promising capability in scavenging energy from mechanical deflections, acoustic waves, fluid or air flows, and even human activities. The output of NGs has reached the sub-milliwatt level, which is sufficient to power many small electronic devices, such as light-emitting diodes (LEDs), laser diodes, pH sensors, UV sensors, speed/weight sensors, and toxic pollutant sensors. The piezoelectric output of NGs has also been used to directly drive electrochemical reactions including lithium ion intercalation, electrodegradation of dyes, and electrochemical water splitting. However, although promising, current designs for NGs still require bendable or deflecting components for mechanical energy conversion, making them difficult to integrate with regular electronic devices. Furthermore, fabrication of NGs typically relies on the large-scale integration of nanostructures, which has proven to be a critical obstacle for scaling up the manufacturing of NGs.

SUMMARY

Piezoelectric materials based on nanoporous polymer foams are provided. Also provided are nanogenerators incorporating the piezoelectric materials, piezoelectric energy harvesters incorporating the nanogenerators and methods of making and using the same.

The piezoelectric materials comprise a unitary nanoporous matrix comprising a piezoelectrically active organic polymer, such as β-phase polyvinylidene fluoride, wherein the pores in the nanoporous matrix are interconnected and the average pore size in the nanoporous matrix is no greater than about 1000 nm.

Nanogenerators incorporating the piezoelectric materials comprise a layer of the piezoelectric material disposed between, and in electrical communication with, a base electrode and a counter electrode.

Piezoelectric energy harvesting systems incorporating the nanogenerators comprise a nanogenerator and an electronic device configured such that the electronic device is powered by the nanogenerator when the nanogenerator is exposed to an external mechanical vibration source. In these systems, the electronic device can be disposed directly on a surface of the nanogenerator and can serve as a proof mass for the nanogenerator.

Methods of harvesting mechanical energy using the piezoelectric energy harvesting systems include the steps of exposing the nanogenerator to vibrational energy from an external mechanical vibration source, whereby the piezoelectric material converts the vibrational energy into electrical energy; and powering the electronic device with the electrical energy.

The piezoelectric materials can be made by methods that include the steps of dispersing particles in a solution comprising a piezoelectrically active organic polymer; forming the solution into a layer and drying the layer to form a film comprising a matrix comprising the organic polymer with the particles dispersed in the matrix; removing the particles from the matrix to form a unitary nanoporous matrix comprising the piezoelectrically active organic polymer, wherein the pores in the nanoporous matrix are interconnected; and poling the unitary nanoporous matrix.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 8. (A) and (B): The voltage output and current output of nanogenerator I in the example. (C) and (D): The voltage output and current output of nanogenerator II in the example.

FIG. 9. (A) Two nanogenerators connected in series and their voltage output (B) and current output (C).

FIG. 10. (A) Two nanogenerators connected in parallel and their voltage output (B) and current output (C).

DETAILED DESCRIPTION

Piezoelectric materials based on nanoporous polymer foams are provided. Also provided are nanogenerators incorporating the piezoelectric materials, piezoelectric energy harvesters incorporating the nanogenerators and methods of making and using the same.

The piezoelectric materials comprise a unitary nanoporous matrix composed of a piezoelectrically active organic polymer, in which the pores are interconnected and have nanoscale diameters. The porosity of piezoelectric foams can be tailored to provide them with superior capability in absorbing mechanical energy, relative to their non-porous counterparts. In addition, because the piezoelectric materials can be cast as thin, mechanically flexible films, they are well-suited for use in nanogenerators that can be directly integrated onto the surface of an electronic device to provide a compact integrated piezoelectric energy harvester. The electric output of such piezoelectric energy harvesters can be further enhanced by connecting multiple nanogenerators together in a single system.

The piezoelectric materials can be fabricated by forming a polymer/nanoparticle composite material in which nanoparticles are dispersed in a continuous polymer matrix and subsequently selectively eliminating the nanoparticles from the matrix, leaving a porous polymer film. As such, the methods provide a simple, scalable means to form nanoporous materials having tailored pore sizes and pore volume fractions.

Figure 1:
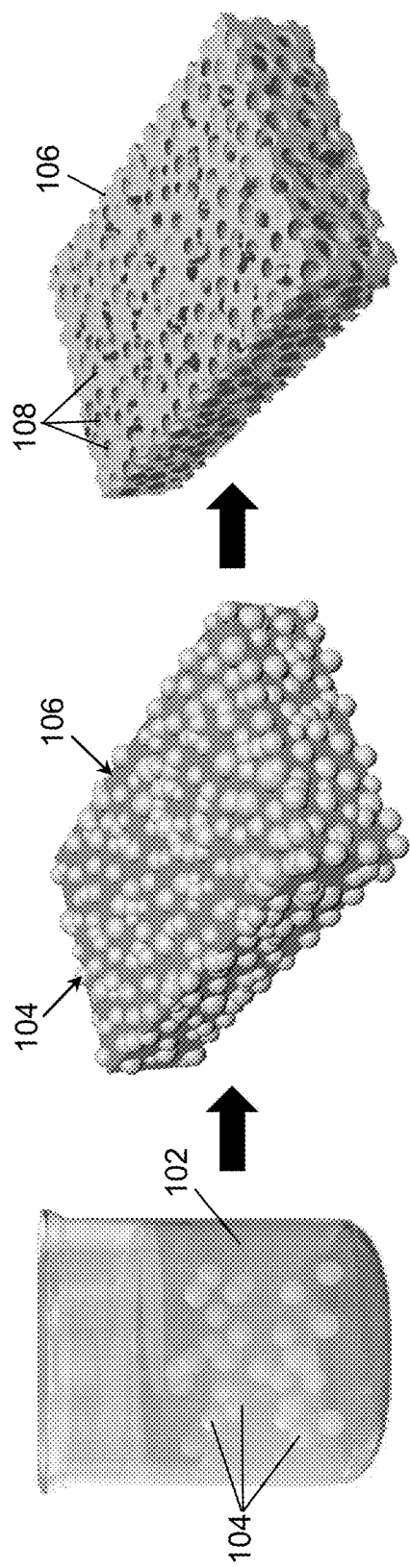
FIG. 1. Schematic illustration of a procedure for the fabrication of a unitary nanoporous piezoelectric material.

FIG. 1 illustrates a method of forming a nanoporous piezoelectric material. As shown in the figure, the method can be carried out by dispersing nanoparticles 104 in a solution 102 comprising a piezoelectrically active organic polymer. The dispersion process may be aided by mechanical mixing and/or sonication and, optionally, dispersing agents. The solution can then be cast as a layer on a substrate and allowed to dry. Heat may be applied to the cast layer in order to expedite the evaporation of water or other solvents and volatile components from the solution. The result is a composite material comprising the nanoparticles 104 dispersed in a matrix of the organic polymer 106. Nanoparticles 104 are then selectively removed from (e.g., by selective etching or dissolution) polymer matrix 106, leaving a nanoporous matrix of the piezoelectrically active polymer in which the size of the pores 108 and the pore volume are defined by the size and volume of the nanoparticles in the original composite material. The nanoporous matrix can then be electrically or thermally poled to align the molecular dipoles of the polymer molecules to produce a piezoelectric material.

The polymer matrix and the nanoparticles can be made from a variety of materials. The polymer of the matrix is an organic polymer having at least one phase that is piezoelectrically active. Piezoelectrically active refers to a polymer having a permanent molecular dipole that can be aligned and that can maintain the alignment once it has been achieved, such that it provides a piezoelectric material. β-phase polyvinylidene fluoride (PVDF) is one example of a suitable matrix polymer. However, other piezoelectrically active polymers may also be used. These include piezoelectric polyamides, polypropylene and polyureas, as well as piezoelectric biopolymers, such as cellulose, collagen and polypeptides. Although the piezoelectric response may be weaker in the piezoelectric biopolymers, their biocompatibility makes them well-suited for medical applications, such as biomedical implants.

The nanoparticles used in the present methods should be inert and selectively removable (e.g., selectively etchable or dissolvable) relative to the matrix polymer. As used here, the term inert means that the nanoparticles do not react with the matrix material to a significant extent in a manner that would negatively impact its piezoelectric properties. In addition, the surface polarity of the nanoparticles is desirably greater than that of the matrix polymer. In some instances, this surface polarity may be due to the presence of polar functions groups, such as —OH groups, on the surface of the nanoparticles. Examples of inorganic materials from which the nanoparticles can be made include semiconductors (such as Si), metal oxides (such as ZnO, MgO, $Al_2O_3$ or $SiO_2$) and inorganic salts (such as NaCl or $CaCO_3$).

In addition to providing a convenient way to tailor the porosity of the present piezoelectric foams, the nanoparticles can also promote the nucleation of piezoelectrically active polar crystalline phases within certain polymers, such as PVDF. The piezoelectric polar phase of the polymer is nucleated as a result of drying-induced strain at the polymer-nanoparticle interface.

The average size, size distribution and loading of the particles in the polymer/nanoparticle composite material can be optimized to provide a piezoelectric film having desired performance characteristics. Typically, particularly for those embodiments in which the nanoparticles promote nucleation of a piezoelectrically active phase in the polymer, a greater particle/polymer interfacial area will correspond to a higher fraction of piezoelectrically active material in the polymer matrix. This relationship generally favors particles having small diameters and high particle loadings. However, as the particle loading increases, the total polymer concentration per unit volume of the foam decreases. Therefore, these effects should be balanced to optimize the particle size and particle loading in order to achieve a material having a high piezoelectric potential. In addition, the particle size and loading should be sufficiently high such that the particles contact other particles in the matrix. This allows for the selective removal of particles throughout the matrix, rather than only at the surfaces. By way of illustration, some embodiments of the polymer/nanoparticle composite materials have a particle volume fraction in the range from about 15% to about 50%. This includes embodiments having a particle volume fraction in the range from about 20% to about 45% and further includes embodiments having a particle volume fraction in the range from about 25% to about 40%. In such embodiments, the average particle size (diameter) for the particles in the matrix may be less than 1000 nm. This includes embodiments in which the average particle size is no greater than about 500 nm, no greater than about 100 nm or no greater than about 50 nm.

Once the polymer/nanoparticle composite material has been formed, the nanoparticles can be selectively removed from the polymer matrix, leaving a unitary nanoporous polymer matrix comprising interconnected pores corresponding substantially in size, shape and position to the nanoparticles previously dispersed therein. As such, the present piezoelectric materials are readily distinguishable from piezoelectrets comprising closed cell foams, which rely on the ionization of air trapped in closed pores. For clarification, the term 'unitary' as used herein is intended to refer to a material composed from a single, continuous body and is meant to distinguish such a material from a multi-unit mat, such as a mat comprising a plurality of nanofibers.

Selective removal may be accomplished using an etchant or solvent that selectively etches or dissolves away the particles, but not the polymer of the matrix, or that etches or dissolves the particles at a substantially higher rate. Therefore, an appropriate etchant or solvent will be selected based on the choice of piezoelectrically active polymer and the material from which the nanoparticles are made. For example, HCl can be used to selectively etch metal oxide particles, such as ZnO particles, from a variety of piezoelectrically active polymers, including PVDF. While the selective removal process might enlarge the pores slightly relative to the nanoparticles, such effects are generally not significant. Thus, some embodiments of the nanoporous matrices have a pore volume fraction in the range from about 15% to about 50%. This includes embodiments having a pore volume fraction in the range from about 20% to about 45% and further includes embodiments having a pore volume fraction in the range from about 25% to about 40%. In such embodiments, the average pore size (diameter) for the pores in the matrix may be less than 1000 nm. This includes embodiments in which the average pore size is no greater than about 500 nm, no greater than about 100 nm or no greater than about 50 nm. The sizes of the pores can be measured using SEM images of the materials, as illustrated in the example below. Because the pores may not be perfectly spherical, the size for a given pore can be taken as its largest diameter.

Although in some embodiments the polymer of the nanoporous matrix will be composed entirely of a piezoelectrically active material, in other embodiments non-piezoelectric phases of the polymer may also be present. For example, in a matrix comprising PVDF, β-phase PVDF may be a majority phase in combination with α-phase and/or γ-phase PVDF. By way of illustration, in some embodiments of the present piezoelectric materials, the polymer of the nanoporous matrix comprises at least 70% by volume piezoelectrically active phases. This includes embodiments in which the polymer of the nanoporous matrix comprises at least 80%, at least 90% and at least 95% by volume piezoelectrically active phases.

Using the method illustrated in FIG. 1, piezoelectric materials can be cast as thin, mechanically flexible films with large areas. The film thickness can be facilely adjusted by the amount of casting mixture. Flexible films are useful because they can be seamlessly attached to, and conform to, rough and/or curved surfaces, such as human skin, for biomechanical energy harvesting applications. By way of illustration, some embodiments of the piezoelectric materials take the form of films having a thickness of no greater than about 100 μm. This includes embodiments having a thickness of no greater than about 10 μm, and further includes embodiments having a thickness of no greater than about 1 μm. The films can be formed over large areas (as measured by the surface area that they cover). For example, the films can be formed with an area of at least 10 cm$^2$, at least 100 cm$^2$ or at least 1000 cm$^2$.

The nanoporous thin films provide a useful platform for developing integratable nanogenerators that convert ambient mechanical energy into electrical energy. The nanogenerators can be constructed by sandwiching a layer of the piezoelectric material between two electrodes. This simple and compact design provides nanogenerators capable of producing high volume power densities. In addition, the flexible thin film configuration allows the nanogenerators to be directly attached to electronic devices. Thus, the present nanogenerators eliminate the need for additional components, such as a cantilever, to transfer ambient mechanical energy from an energy source to the piezoelectric material.

Mechanical resonance between an external energy source and the present piezoelectric materials is not required for energy harvesting applications. Instead, the nanogenerators are able to harvest ambient vibrational energy over a broad frequency range from ~1 Hz (or even less) to 1000 Hz, 10,000 Hz (or even greater). For example, as illustrated in the example below, the nanogenerators can be designed to harvest mechanical vibrational energy over a vibrational frequency range from 20 to 60 Hz. This is significant because this range includes common oscillation frequencies for ambient environments.

The present piezoelectric materials are able to exhibit improved piezoelectric response, in terms of piezoelectric potential and current, relative to their non-porous counterparts. For example, as illustrated in the example below, the nanogenerators can be configured to produce a piezoelectric potential that is at least twice that of its non-porous counterpart under the same force conditions. Some embodiments of the nanogenerators are able to generate an output power of 0.1 mW/cm$^3$ or greater.

A significant advantage of the nanogenerators is their ability to be readily integrated into piezoelectric energy harvesting systems. In some embodiments, a single nanogenerator is integrated into the system. However, because the nanogenerators do not require additional component to fulfill the energy harvesting function, multiple nanogenerators can be simply integrated into a single system and operate with identical phase and frequency. This feature allows direct multiplication of the nanogenerators' AC output without rectifying them first. The integration can be accomplished by connecting two or more nanogenerators in series or in parallel.

Figure 3:
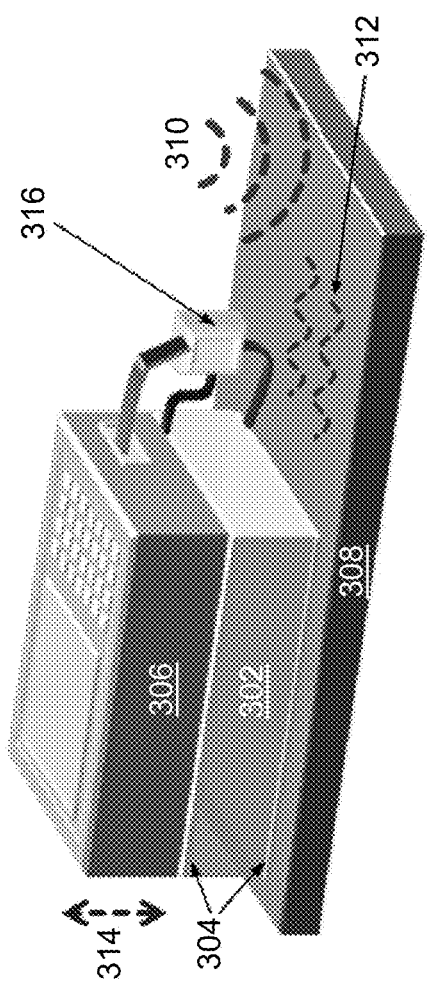
FIG. 3. Schematic diagram of a piezoelectric energy harvesting system.

An illustrative embodiment of an energy harvesting system incorporating a nanoporous foam is shown in FIG. 3. The system includes a nanogenerator comprising a unitary nanoporous matrix 302 comprising an piezoelectrically active organic polymer sandwiched between two electrodes 304. An electronic device 306 is disposed on the surface of the upper electrode and serves as the proof mass for the nanogenerator. A substrate 308 supports the nanogenerator. During operation, a vibration is generated by an external vibrational energy source 310 and is transported 312 via substrate 308 to the nanogenerator creating a vertical oscillation 314 in the nanoporous film, which is converted into electrical energy, that can be used to power electronic device 306. As shown here, the AC output of the nanogenerator can be converted into a DC current via a DC converter 316. External vibrational energy source 310 may come in a variety of forms. Examples of external vibrational energy sources include buildings, automotives, electrical appliances, acoustic waves, fluid or air flows and human movements.

Electronic devices that can be connected to and powered by the nanogenerators include, but are not limited to, cellular phones, computers (particularly low-power computers), lights (such as light-emitting diodes (LEDs)), laser diodes, sensors (e.g., sensors for chemical and biological agents, pH sensors, radiation sensors, speed/weight sensors) and medical implants.

EXAMPLE

This example illustrates the fabrication and performance of a piezoelectric energy harvester based on a piezoelectric nanoporous PVDF film.

Methods:

Fabrication of Nanoporous PVDF Thin Films.

PVDF powder (Sigma Aldrich) was dissolved in N,N-dimethylformamide DMF solvent (10 wt. %) at 65° C. The PVDF solution was mixed with ZnO nanoparticles (35-45 nm, US Research Nanomaterials, Inc.). The mass ratio of ZnO nanoparticles to PVDF was adjusted to form different porosity films. The mixture was treated with ultrasonic for 30 min to generate a PVDF/ZnO nanoparticle suspension. The suspension was cast uniformly in a Petri-dish and dried at 75° C. Free standing films were obtained after adding some HCl solution in the Petri-dish. The films were immersed in 37 wt. % HCl solution to completely remove the ZnO nanoparticles (NPs). After acid etching, the films were washed by deionized (DI) water and accordingly the nanoporous PVDF thin films were fabricated.

Experimental setup.

Figure 4:
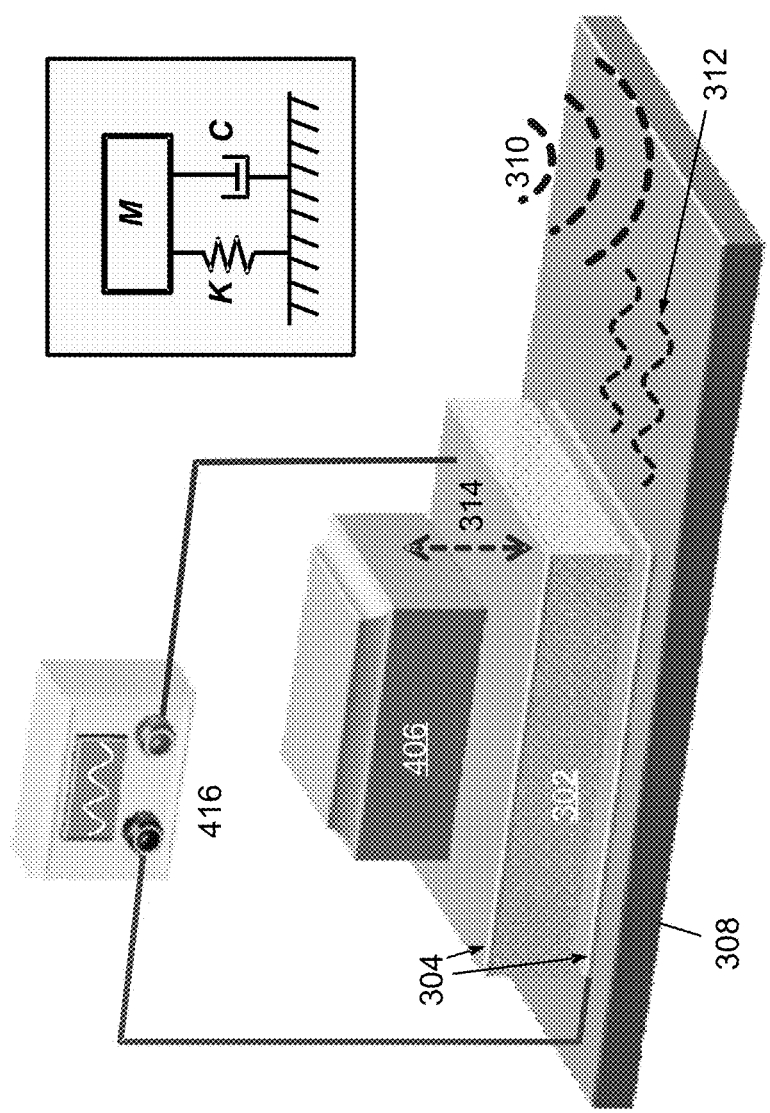
FIG. 4. Schematic diagram of the experimental set-up for the example.

The experimental set-up for testing the nanogenerator is shown in FIG. 4. The set-up was the same as that for the system of FIG. 3, except that a weight 406 was used to simulate the electronic device and to serve as a proof mass. Also, rather than being connected to an electronic device, the nanogenerator was connected to an oscilloscope 416 in order to characterized the device's performance. A nanoporous PVDF thin film was cut into a 1×2 cm belt and taped with Cu foil electrodes on both sides to form a flexible nanogenerator (NG). An electrical poling process was carried out by applying an electric field of 600 V for 2 h. The NG with a proof mass on top was attached to a fixed wood supporting substrate. The acoustic wave input was provided by a functional vibrator, which can supply vertical oscillations over a range of frequencies. The generated mechanical oscillations were transported through the substrate and harvesting by the NG. And then the NG converted the oscillating mechanical energy to electricity.

Results.

Figure 2:
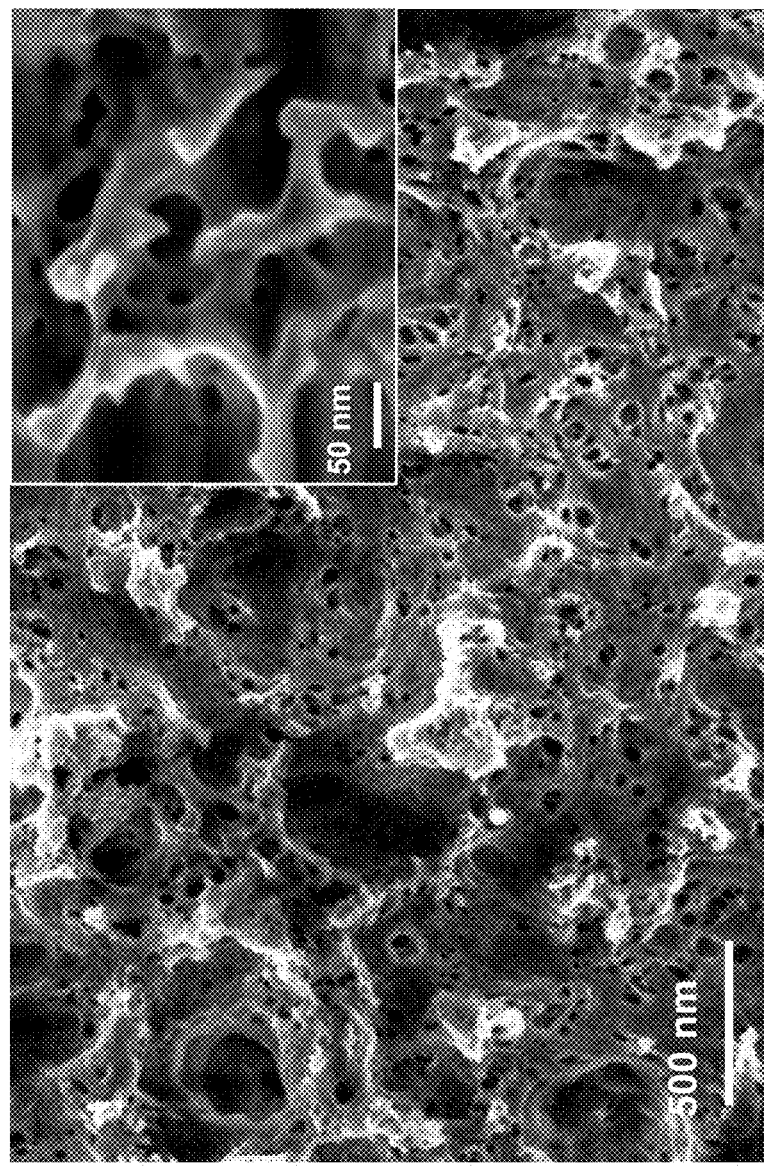
FIG. 2. SEM image of a nanoporous PVDF thin film fabricated from the 50% ZnO mass fraction mixture of ZnO nanoparticles and PVDF.

A scanning electron microscopy (SEM) image of the nanoporous PVDF film, provided in FIG. 2, shows the sponge-like nanoporous structure of the PVDF thin film after removing ZnO NPs. The pore sizes were consistent with those of the ZnO nanoparticles (35-40 nm in average, inset of FIG. 2). (The largest openings in the image correspond to imperfections in the surface of the film, rather than to pores.) The pores are interconnected, which allows ZnO NPs to be completely removed, as evidenced by the fact that only the elements C and F were detected in the energy dispersive X-ray spectroscopy (EDS) spectrum for the material. Fourier transform infrared (FTIR) spectroscopy was used to confirm the crystal phase of the nanoporous PVDF thin film. The characteristic peaks of the β-phase at 509, 840 and 1280 cm$^{-1}$ were clearly observed in the FTIR spectrum.

Through this method, a large area nanoporous PVDF thin film (18.5 cm in diameter) was fabricated, demonstrating the capability of producing high quality piezoelectric polymer thin films in a large scale.

Figure 5A:
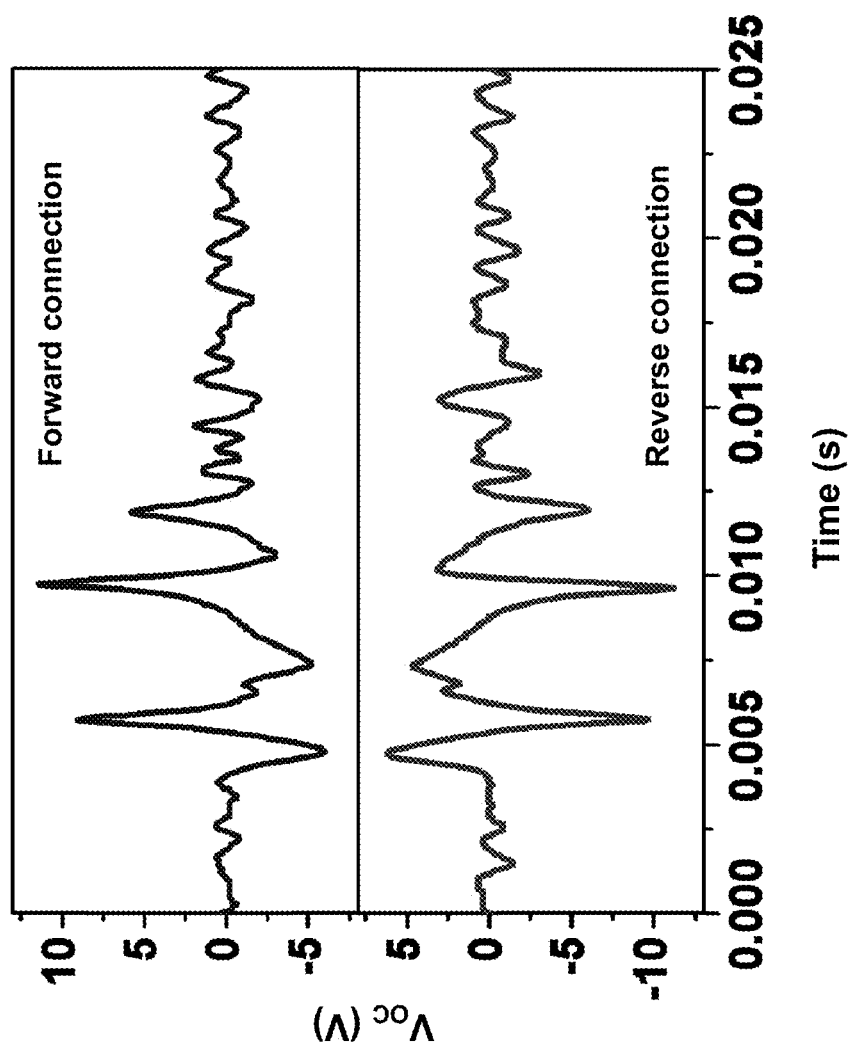
FIG. 5. (A) voltage output of the nanogenerator in the system of FIG. 4, generated by one oscillation under forward and reverse connections; voltage output (B) and current output (C) of the nanogenerator under continual oscillations.
Figure 5B:
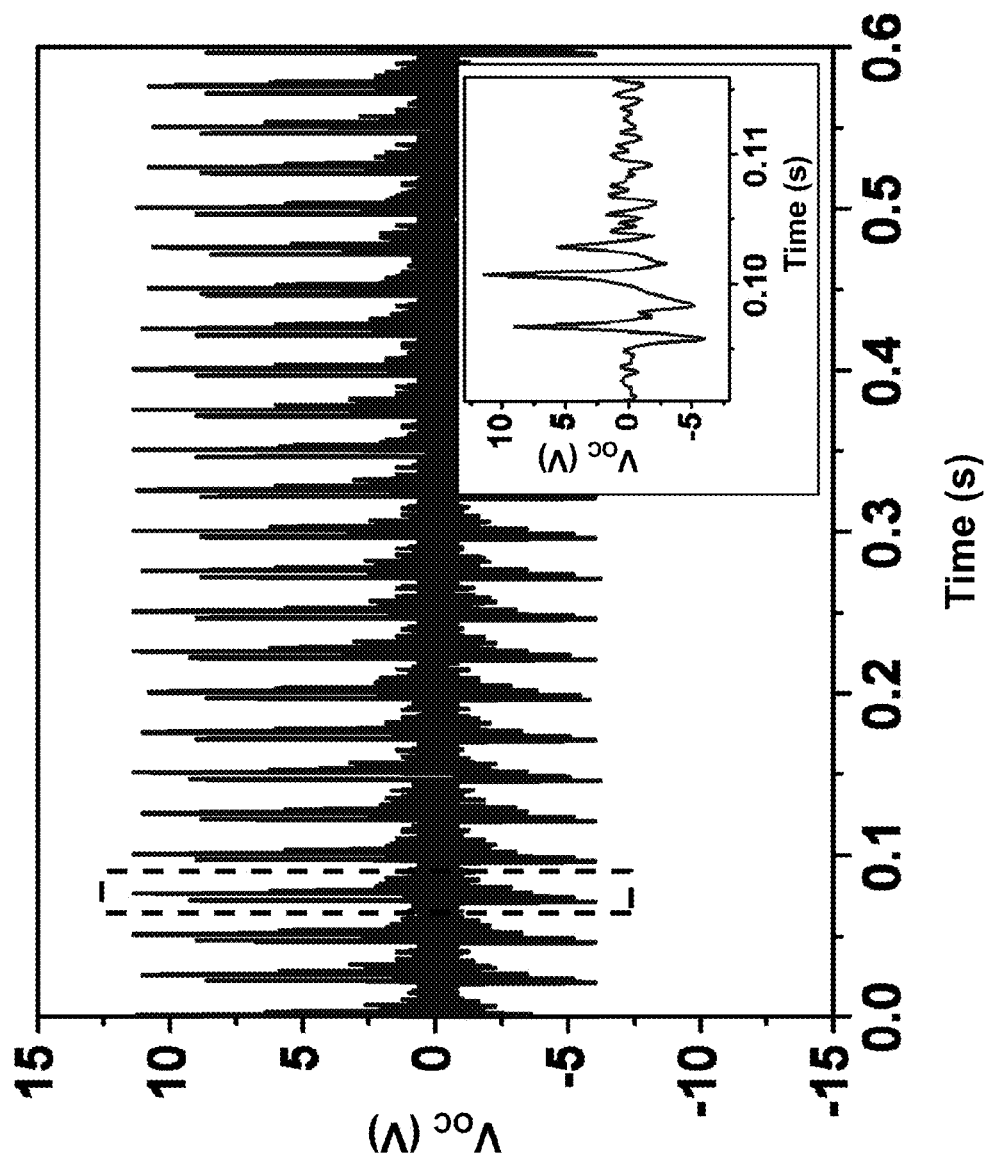
Figure 5C:
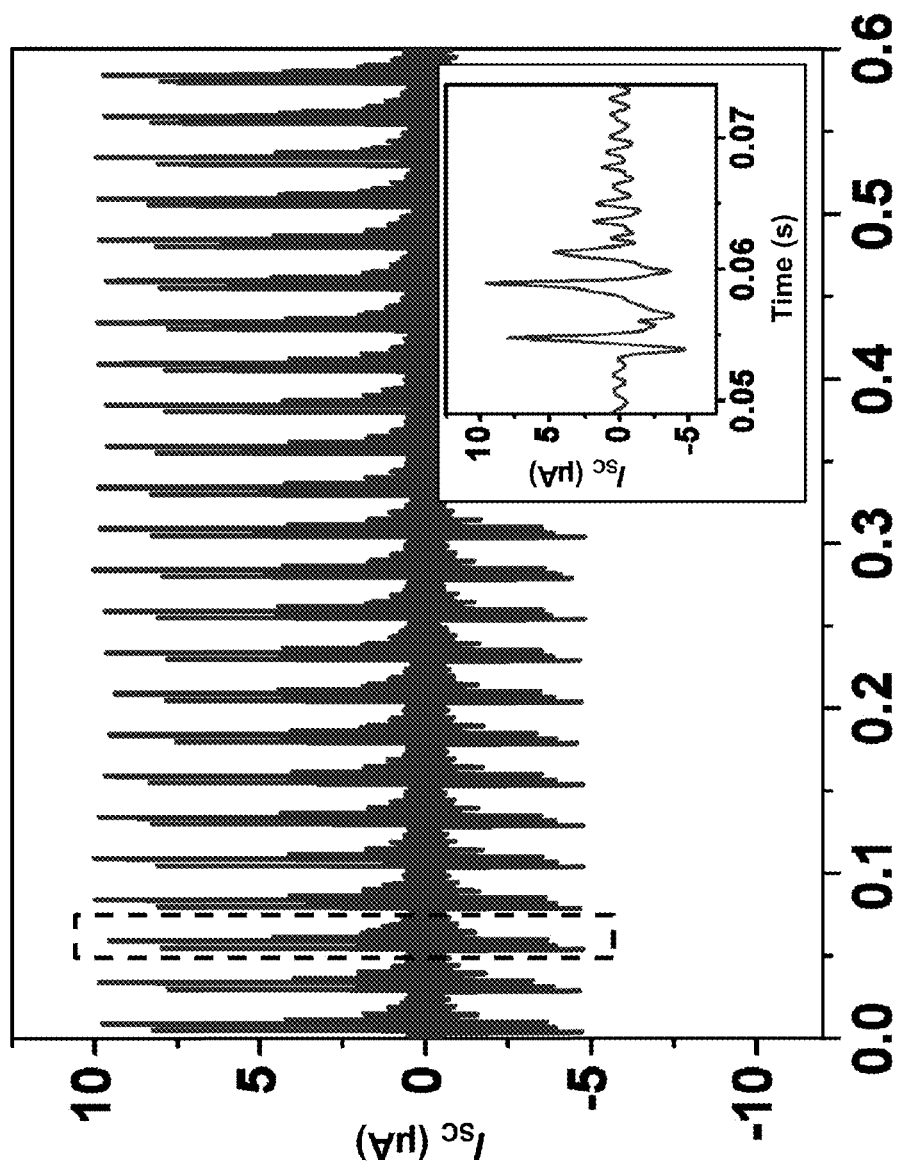

In this study, a piece of aluminum block was used in place of an electronic device to test the energy harvesting ability. As schematically shown in FIG. 4, a PVDF NG (2 cm×1 cm×28 μm) with the aluminum block (65 g) on top was placed on a flat surface. A vibration source was located 6 cm away from the NG and created vibration of the surface with controlled frequency. The open-circuit voltage ($V_{OC}$) of the NG under forward and reverse connections was measured during the oscillation. The upper panel of FIG. 5(A) shows the $V_{OC}$ signal generated by one agitation with a triggering frequency of 40 Hz. In the case of the reverse connection, the $V_{OC}$ demonstrated identical amplitude with reversed polarization (the lower panel of FIG. 5(A)), which confirms the genuineness of the piezoelectric output signals. FIGS. 5(B) and (C) show the $V_{OC}$ and short-circuit current ($I_{SC}$) of the NG under continual oscillations at the frequency of 40 Hz. The average peak values of the $V_{OC}$ and $I_{SC}$ were found to be about 11.0 V and 9.8 μA, respectively. Within one agitation cycle, the out signal quickly dropped to the base level after three-cycles of oscillation, indicating large damping of the PVDF film like a sponge layer. The NG was able to work over a long period of time under the constant oscillation without noticeable degradation in the output signal.

To investigate the effect of film porosity on piezoelectric response, PVDF thin films with different porosities were prepared from mixtures with a series of ZnO mass (and volume) fractions. The $V_{OC}$ of these nanoporous PVDF thin films with identical thicknesses (28 μm) was measured at a frequency of 40 Hz, and their peak values were plotted as a function of porosity (FIG. 6(A)). The peak $V_{OC}$ increased from 3.5 V to 11.0 V as the porosity increased from 6.5% to 32.6% (corresponding to a ZnO mass fraction increase from 10% to 50%), and then decreased to 8.3 V as the porosity further increased to 45.5% (corresponding to a ZnO mass fraction increase to 70%). The optimal porosity for achieving maximum $V_{OC}$ output (~11 V) was identified as a mass fraction of ~50% (volume fraction ~33%). The porosity-output relationship was directly related to the amount of β-phase PVDF. The spontaneous formation of β-phase PVDF in this approach was due to residual stress at the polymer-oxide interface. Such stress only penetrates into the polymer film with limited depth. Therefore, increasing the amount of ZnO NPs yielded more interfaces and higher β-phase volume ratio. Meanwhile, the total amount of PVDF per unit volume decreases as the ZnO:polymer ratio increased. As evidenced by FTIR spectra, the amount of α-phase in the as-prepared PVDF film monotonically decreased as the ZnO ratio increased. The amount of β-phase increased as the ZnO mass ratio increased from 10% to 50%, and then decreased when the ZnO mass fraction further increased. The nanoporous PVDF film made from the mixture with 50% ZnO (by mass) possessed the maximum β-phase quantity, corresponding to the highest piezoelectric potential.

Figure 6A:
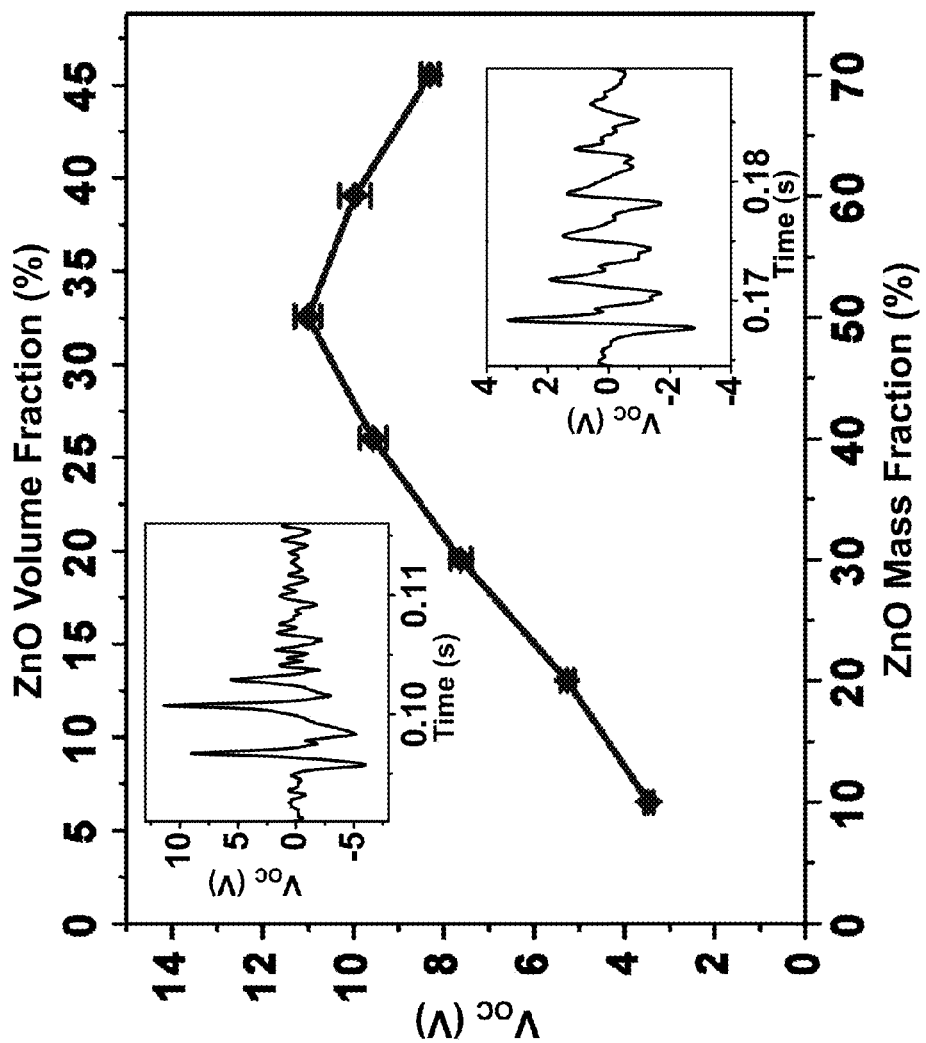
FIG. 6. (A) The voltage output of PVDF thin films with different porosities. The upper and lower inset show the voltage output signal generated by one triggering oscillation of the nanoporous PVDF thin films prepared from the 50% and 10% ZnO mass fraction mixtures, respectively. (B) The voltage outputs from a nanoporous PVDF thin film and a bulk 3-phase PVDF thin film under a range of triggering frequencies. Each point is taken from the peak open-circuit voltage.

The upper and lower insets in FIG. 6(A) show the voltage output signal generated by one triggering oscillation, corresponding to the nanoporous PVDF thin films prepared from the 50% and 10% ZnO mass fraction mixtures, respectively. The waveform of the voltage signal for the lower porosity PVDF thin film includes a series of voltage peaks related to free vibration and decaying oscillation. By contrast, the higher porosity PVDF thin film has fewer voltage peaks and generates a sharp, high output peak in the signal waveform. It is demonstrated that the higher porosity PVDF thin film with a bigger damping factor can convert the oscillating mechanical energy into electricity more quickly and efficiently, achieving a higher output signal. Hence, the porosity of the PVDF thin films significantly affects the piezoelectric performance of converting the oscillating mechanical energy.

Figure 6B:
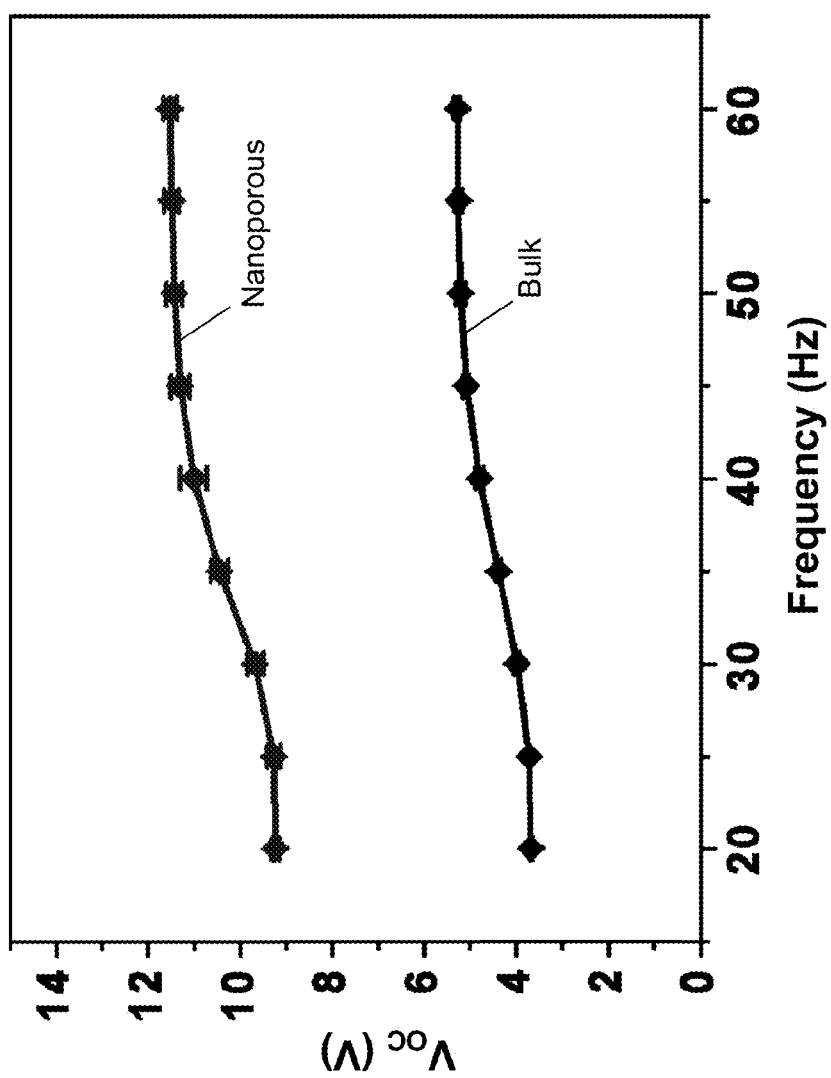

PVDF NGs (made from 50% by mass ZnO mixture) were further tested within a frequency range from 20 to 60 Hz, which comprises common oscillation frequencies found in the ambient environment. Because these frequencies were far away from resonance frequency of the PVDF film-weight system, the piezoelectric output was nearly independent of the agitation frequency and the maximum $V_{OC}$ remained between 9.2-11.5 V (blue diamonds in FIG. 6(B)), the slight increase after 30 Hz was due to a vibrator input power increase). To further demonstrate the advantage of nanoporous PVDF thin film for harvesting oscillating mechanical energy, solid β-phase PVDF thin films were prepared according to the methods described in Satapathy et al., *Bull. Mater. Sci.* 34, 727-733 (2011) and tested within the same frequency range and under the same vibrator power. The same sized solid PVDF film produced peak $V_{OC}$ in the range from 3.7 V to 5.3 V (black diamonds in FIG. 6(B)), which was over two times lower than those of the corresponding porous films.

Figure 7A:
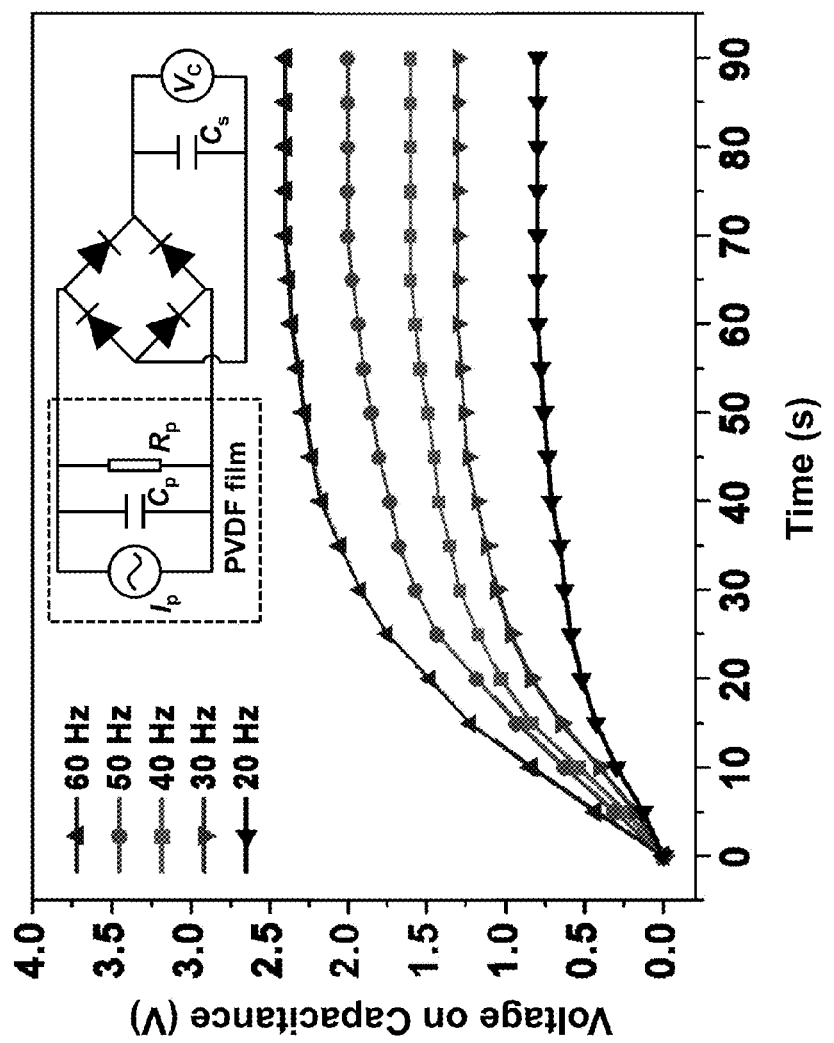
FIG. 7. (A) Voltage across a capacitor when being charged by a nanogenerator under different triggering frequencies. The inset is the equivalent circuit. (B) The output power under different triggering frequencies.
Figure 7B:
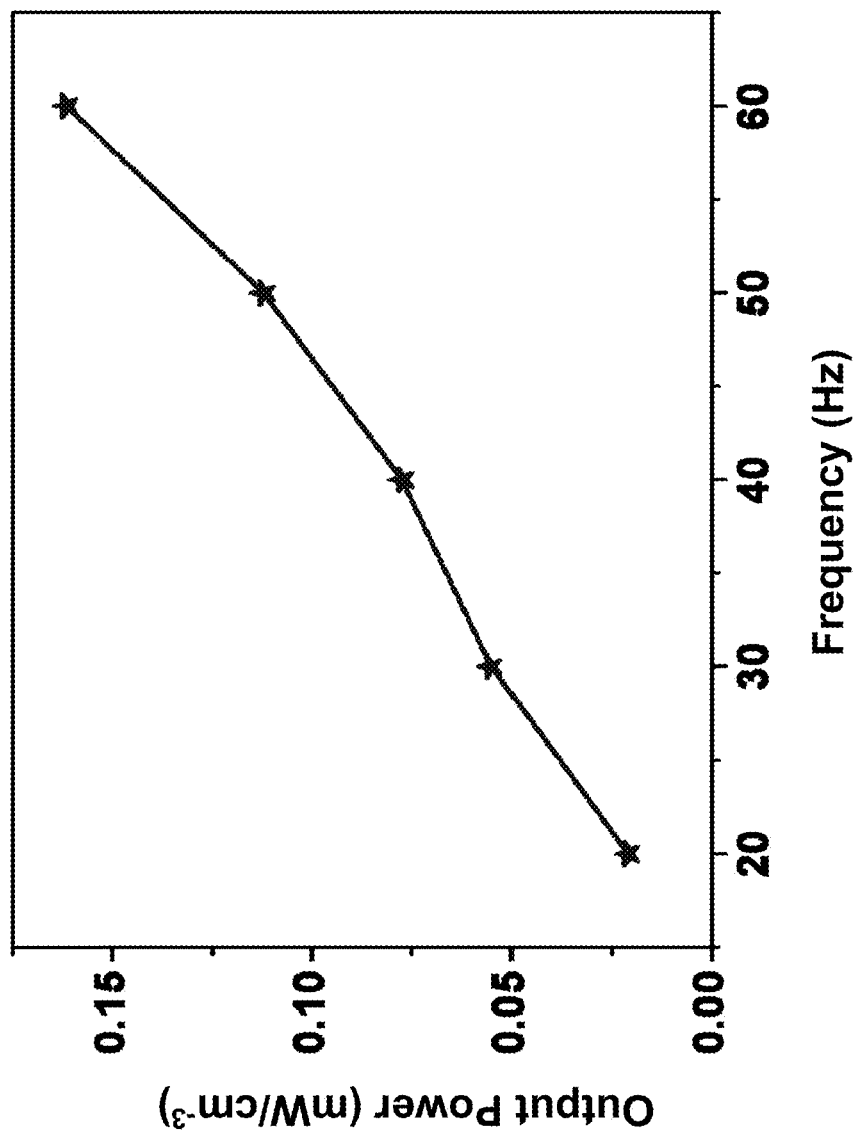

To demonstrate the application of the NGs as a direct current (DC) power source, a nanoporous PVDF NG was connected in parallel to a capacitor (22 μF) through a full-wave bridge circuit, as shown by the equivalent circuit in the inset of FIG. 7(A). The alternating current (AC)

piezoelectric output can be fully rectified though the bridge circuit with negligible loss. FIG. 7(A) illustrates the charging process of the capacitor under different agitation frequencies. Higher frequency yielded higher saturation voltage of the capacitor, which is a result of equilibrium established between the NG charging rate and the capacitor leakage rate. The voltage held by the capacitor was reached to 2.4 V in 70 s at a frequency of 60 Hz. Based on the charging curves, the output power of the nanoporous PVDF NG was calculated via equation: $P=CU^2/2$ t, where C is the capacitance of the capacitor, U is the saturation voltage, and t is the time for the voltage to reach the saturation point. This is the practical power output on the specific capacitor. It monotonically increased as a function of agitation frequency from 0.02 mW/cm$^3$ to 0.16 mW/cm$^3$ at 60 Hz (FIG. 7(B)).

In order to demonstrate the integration of multiple NGs into a single energy harvesting system, two PVDF NGs were fabricated and attached to the same aluminum block. When operated under 40 Hz, the peak $V_{OC}$ and $I_{SC}$ output of NG I and NG II was 11.1 V, 9.7 µA (FIGS. 8(A) and (B)) and 11.0 V, 9.8 µA (FIGS. 8(C) and (D)), respectively. By connecting these two NGs in serial, the peak $V_{OC}$ output increased to 20.2 V, which was approximately the sum of the peak $V_{OC}$ of each NGs. Meanwhile, the peak $I_{SC}$ output was barely affected (9.3 µA) and only 4.1% drop was observed in comparison to the lower peak $I_{SC}$ (9.7 µA) of the two individual NGs (FIG. 9(A)-(C)). For parallel connection as shown in FIG. 10(A)-(C), the peak $I_{SC}$ was largely increased to 17.5 µA, which was only 10.3% less than the sum of the peak $I_{SC}$ of both NGs. Meanwhile the peak $V_{OC}$ nearly remained at the same individual level (10.5 V). The loss of output could be attributed to the leakage of electric charge through the connection circuit. This result reveals that PVDF NGs integration follows the general rules of battery connection, although their outputs are in AC form.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A piezoelectric material comprising a unitary nanoporous matrix comprising a piezoelectrically active organic polymer that defines a plurality of open pores, wherein the open pores defined by the piezoelectrically active organic polymer are interconnected and do not contain particles and the average pore size in the nanoporous matrix is no greater than about 1000 nm.

2. The piezoelectric material of claim 1, wherein the average pore size in the nanoporous matrix is no greater than about 100 nm.

3. The piezoelectric material of claim 1, wherein pore volume fraction of the nanoporous matrix is in the range from about 15% to about 50%.

4. The piezoelectric material of claim 1, wherein the piezoelectrically active organic polymer is β-phase polyvinylidene fluoride.

5. The piezoelectric material of claim 4, wherein the pore volume fraction of the nanoporous matrix is in the range from about 25% to about 40%.

6. The piezoelectric material of claim 5, wherein the average pore size in the nanoporous matrix is no greater than about 50 nm.

7. The piezoelectric material of claim 1, wherein the piezoelectrically active organic polymer is a biopolymer.

8. The piezoelectric material of claim 1, wherein the piezoelectrically active organic polymer is a polyamide or a polyurea.

9. A nanogenerator comprising a layer of the piezoelectric material of claim 1, disposed between and in electrical communication with a base electrode and a counter electrode.

10. A piezoelectric energy harvesting system comprising a nanogenerator and a electronic device, wherein the nanogenerator and the electronic device are configured such that the electronic device is powered by electrical energy generated by the nanogenerator when the nanogenerator is exposed to an external mechanical vibration source, the nanogenerator comprising a layer of piezoelectric material disposed between and in electrical communication with a base electrode and a counter electrode, the piezoelectric material comprising a unitary nanoporous matrix comprising a piezoelectrically active organic polymer, wherein the pores in the nanoporous matrix are interconnected and the average pore size in the nanoporous matrix is no greater than about 1000 nm.

11. The system of claim 10, wherein the electronic device is disposed on a surface of the nanogenerator and serves as a proof mass for the nanogenerator.

12. A method of harvesting vibrational energy using a piezoelectric energy harvesting system comprising a nanogenerator and a electronic device, wherein the nanogenerator and the electronic device are configured such that the electronic device is powered by electrical energy generated by the nanogenerator when the nanogenerator is exposed to an external mechanical vibration source, the nanogenerator comprising a layer of piezoelectric material disposed between and in electrical communication with a base electrode and a counter electrode, the piezoelectric material comprising a unitary nanoporous matrix comprising a piezoelectrically active organic polymer, wherein the pores in the nanoporous matrix are interconnected and the average pore size in the nanoporous matrix is no greater than about 1000 nm, the method comprising;

exposing the nanogenerator to vibrational energy from an external mechanical vibration source, whereby the piezoelectric material converts the vibrational energy into electrical energy; and powering the electronic device with the electrical energy.

13. A method of making a piezoelectric material, the method comprising:

dispersing particles in a solution comprising a piezoelectrically active organic polymer;

forming the solution into a layer and drying the layer to form a film comprising a matrix comprising the organic polymer with the particles dispersed in the matrix;

removing the particles from the matrix to form a unitary nanoporous matrix comprising the piezoelectrically active organic polymer, wherein the pores in the nanoporous matrix are interconnected; and poling the unitary nanoporous matrix.

14. The method of claim 13, wherein the average pore size in the nanoporous matrix is no greater than about 1000 nm.

15. The method of claim 13, wherein the average pore size in the nanoporous matrix is no greater than about 100 nm.

16. The method of claim 13, wherein pore volume fraction of the nanoporous matrix is in the range from about 15% to about 50%.

17. The method of claim 13, wherein the piezoelectrically active organic polymer is β-phase polyvinylidene fluoride.

18. The method of claim 17, wherein the pore volume fraction of the nanoporous matrix is in the range from about 25% to about 40%.

19. The method of claim 13, wherein the nanoparticles promote the nucleation of piezoelectrically active polar crystalline phases within the piezoelectrically active organic polymer as the layer dries.

20. The method of claim 19, wherein the piezoelectrically active organic polymer is β-phase polyvinylidene fluoride.

21. The system of claim 10, wherein the piezoelectrically active organic polymer defines a plurality of open pores and the open pores defined by the piezoelectrically active organic polymer do not contain particles.

22. The method of claim 12, wherein the piezoelectrically active organic polymer defines a plurality of open pores and the open pores defined by the piezoelectrically active organic polymer do not contain particles.

* * * * *